(12) United States Patent
Kawashima et al.

(10) Patent No.: US 6,389,275 B1
(45) Date of Patent: May 14, 2002

(54) SIGNAL RECEIVER AND METHOD THEREOF, TRANSCEIVER, AND NETWORK SYSTEM

(75) Inventors: Hidemitsu Kawashima, Yamato; Akihiko Nakamura, Kawasaki; Yoichi Toguchi, Zama, all of (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 09/342,230

(22) Filed: Jun. 29, 1999

(30) Foreign Application Priority Data

Jun. 30, 1998 (JP) ............................................ 10-183549

(51) Int. Cl.[7] ................................................ H04B 1/16
(52) U.S. Cl. ........................................ 455/336; 455/215
(58) Field of Search ................................ 455/336, 307, 455/78, 215; 330/229; 365/45

(56) References Cited

U.S. PATENT DOCUMENTS

| | | | |
|---|---|---|---|
| 4,393,514 A | | 7/1983 | Minakuchi et al. ......... 455/336 |
| 5,105,162 A | * | 4/1992 | Fleissner et al. ............. 329/359 |
| 5,146,613 A | * | 9/1992 | Anderson ..................... 455/78 |
| 5,630,216 A | * | 5/1997 | McEwan ....................... 455/215 |
| 5,734,975 A | * | 3/1998 | Zele et al. ................... 455/307 |
| 5,907,799 A | * | 5/1999 | Morey ......................... 455/336 |
| 6,057,735 A | * | 5/2000 | Cloutier ..................... 330/279 |
| 6,104,626 A | * | 8/2000 | Katakura et al. ............. 365/45 |

FOREIGN PATENT DOCUMENTS

EP        0 794 622 A1    3/1997

* cited by examiner

*Primary Examiner*—Dwayne Bost
*Assistant Examiner*—L. West
(74) *Attorney, Agent, or Firm*—Dickstein Shapiro Morin & Oshinsky LLP

(57) ABSTRACT

A signal receiver includes a superregenerative circuit for feeding back a part of an output signal to form part of an input signal through a feedback route to execute a superregeneration, a capacitance element disposed in the feedback route of the superregenerative circuit, a switch for switching the capacitance element, and a PLL circuit for generating a clock signal for switching the switch based on an output of the superregenerative circuit.

12 Claims, 20 Drawing Sheets

INTEGRATING CIRCUIT
52

SCF

SIGNAL RECEIVER AND METHOD THEREOF, TRANSCEIVER, AND NETWORK SYSTEM

BACKGROUND OF THE INVENTION

1. Field of the Invention

This invention relates to a signal receiver and a method thereof, a transceiver, and a network system, and particularly to improved signal receiver and method thereof, transceiver, and network system, wherein a reception frequency may be easily changed to a desired frequency.

2. Description of the Related Art

A superregenerative detection mode has characteristics such that a signal can be detected comparatively in high-sensitivity by a simple circuit configuration. So, for example, this superregenerative detection mode is applied to a keyless entry system for locking or unlocking a lock of a door of an automobile by utilizing a radio wave or an infrared ray.

FIG. 25 shows a construction of a well-known superregenerative circuit utilized in such a keyless entry system. This superregenerative circuit includes an adder 1, an amplifier 2 for amplifying a signal from the adder 1 to produce an output, an extraction circuit 3 for extracting a part of the output from the amplifier 2 to be fed back to the adder 1, and a quenching oscillator circuit 4 for controlling an amplified degree of the amplifier 2, in which the adder 1 adds a signal extracted by the extraction circuit 3 to a received signal of a radio wave transmitted from a signal transmission apparatus through an antenna (neither is illustrated).

The signal, which was transmitted from the signal transmission apparatus and received by the antenna, is entered into the amplifier 2 through the adder 1. The amplifier 2 amplifies the input signal and produces an amplified output. The amplification degree of the amplifier 2 is controlled for the correspondence to the signal which the quenching oscillator circuit 4 outputs. An oscillation frequency of the quenching oscillator circuit 4 is set by a predetermined frequency much lower than a carrier frequency of the transmitted signal entered into the adder from the signal transmission apparatus.

The extraction circuit 3 extracts a frequency component of the carrier of the received signal from output of the amplifier 2 to be applied to the adder 1. The adder adds the signal supplied by the extraction circuit 3 to the received feeble signal to be applied to the amplifier 2. When the level of the entered modulation signal is almost zero, the high frequency oscillation action of the superregenerative circuit does not stop, but the entered modulation signal is in a weak oscillation state. The oscillation becomes strong by addition of the signal of the carrier frequency to produce the signal from the amplifier 2. The superregenerative circuit synchronizes with the carrier frequency to make a high frequency oscillation allowing the output of the amplifier 2 to become a signal of a carrier at a large level.

Thus, the carrier at a large level is produced from the amplifier 2 when a modulation signal exists, whereby the signal transmitted from the signal transmission apparatus may be read by detecting the carrier.

In this way, superregeneration is executed in the superregenerative circuit by employing the extraction circuit 3 in the feedback route and feeding back a component of a predetermined frequency from the extraction circuit 3. Accordingly, the extraction circuit 3 is composed of an LC resonance circuit or a delay line of SAW (Surface Acoustic Wave). When the reception frequency is required to be changed, however, for example, a value of the coil or the capacitor in the LC resonance circuit has to be adjusted into a different value by a manual operation. As schematically shown in FIG. 26, there is the problem that the frequency bandwidth for superregeneration can be adjusted only to a small extent. If the delay line of SAW represents the extraction circuit 3, there is a problem such that the frequency may not be changed.

SUMMARY OF THE INVENTION

It is, therefore, a primary object of this invention to provide a superregenerative circuit where the reception frequency may be adjusted among a wide range of values.

According to an aspect of this invention, there is provided a signal receiver including a superregeneration means for feeding back a part of an output signal to form part of an input signal through a feedback route to execute a superregeneration, a capacitance element disposed in the feedback route of the superregeneration means, a switching means for switching the capacitance element, and a generating means for generating a clock signal for switching the switching means based on an output of the superregeneration means.

According to another aspect of this invention, there is provided a transceiver including a signal transmitter for transmitting a signal to other transceiver, and the above-mentioned signal receiver for receiving a signal transmitted from the other transceiver.

According to a further aspect of this invention, there is provided a network system including a plurality of the above-mentioned transceivers.

According to still another aspect of this invention, there is provided a signal reception method including the steps of generating a clock signal for switching a switching means based on an output of the superregeneration means, and of switching the switching means based on the generated clock signal.

In the above-mentioned signal receiver and the signal reception method, the switching means is designed to switch the capacitance element for the correspondence to the clock formed based on the output of the superregeneration means, whereby the superregenerated frequency may be adjusted to an optional value.

The above-mentioned transceiver and the network system employ the above-mentioned signal receiver, whereby the frequency may be adjusted to an optional value for signal receipt and transmission.

BRIEF DESCRIPTION OF THE DRAWINGS

For a more complete understanding of this invention reference is now made to the following description of the accompanying drawings wherein.

DESCRIPTION OF THE PREFERRED EMBODIMENT

Figure 1:
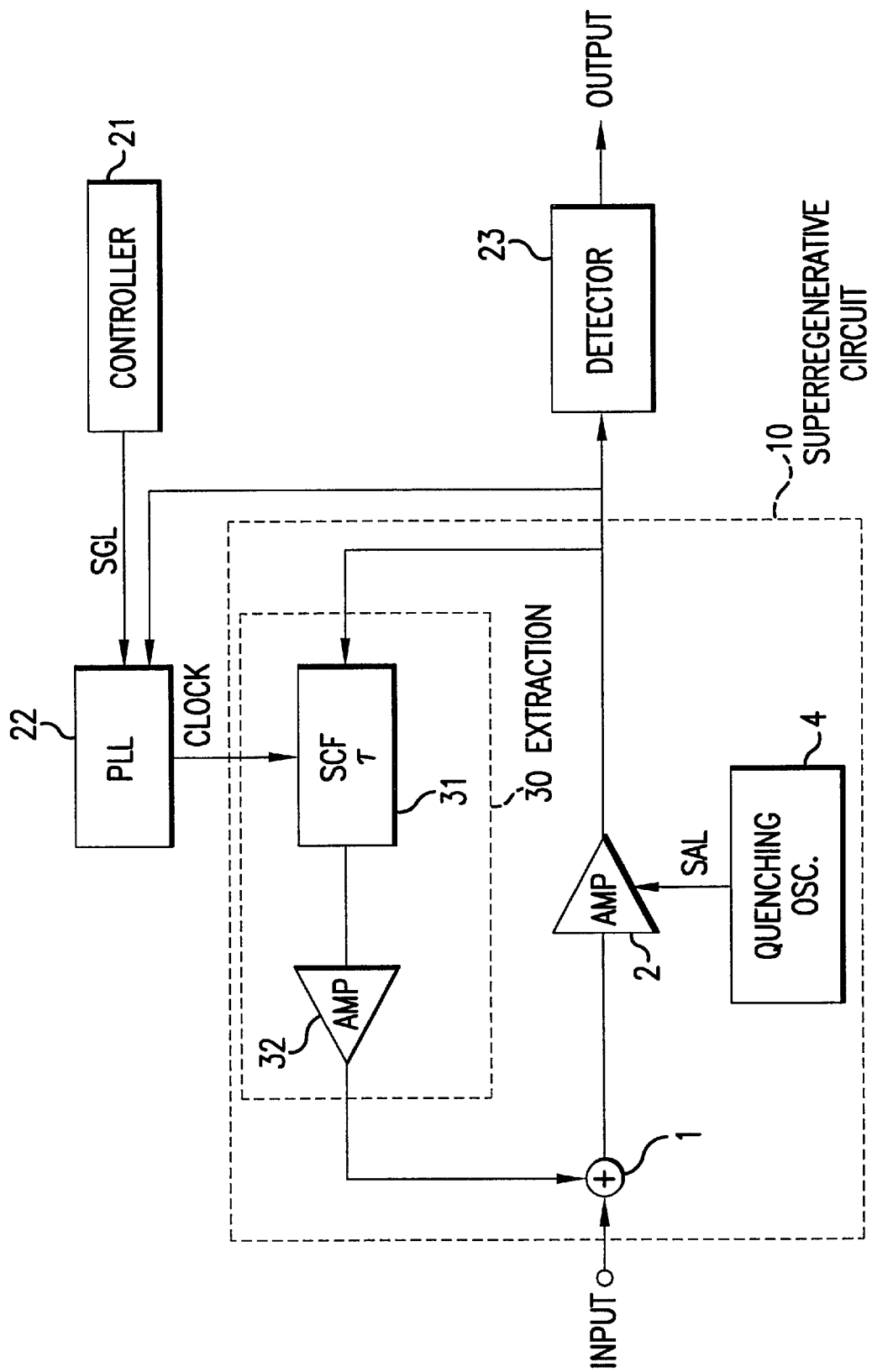
FIG. 1 is a schematic block diagram showing a construction of a signal receiver according to a first embodiment of this invention.

Returning to FIG. 1, there is shown a signal receiver according to a first embodiment of this, which includes a superregenerative circuit 10, a controller 21, a PLL circuit 22, and a detector circuit 23. The superregenerative circuit 10 includes an adder 1, an amplifier 2, a quenching oscillator circuit 4 and an extraction circuit 30. The extraction circuit 30 includes an SCF (switched capacitor filter) 31 which delays an output from the amplifier 2 by a predetermined time $^2\tau$ in synchronization with an entered clock, an amplifier 32 amplifying an output of the SCF 31 to be applied to the adder 1. Thus, the Q can be made large in an appearance by incorporating the amplifier 32 in a feedback route.

An output of the superregenerative circuit 10 is applied to the detector circuit 23 for detection. The output of the amplifier 2 is also applied to the PLL circuit 22. The PLL circuit generates a clock having a predetermined frequency to be applied to the SCF 31 so that the frequency produced by the amplifier 2 may become a value corresponding to a control signal SGL from the controller 21.

Figure 2:
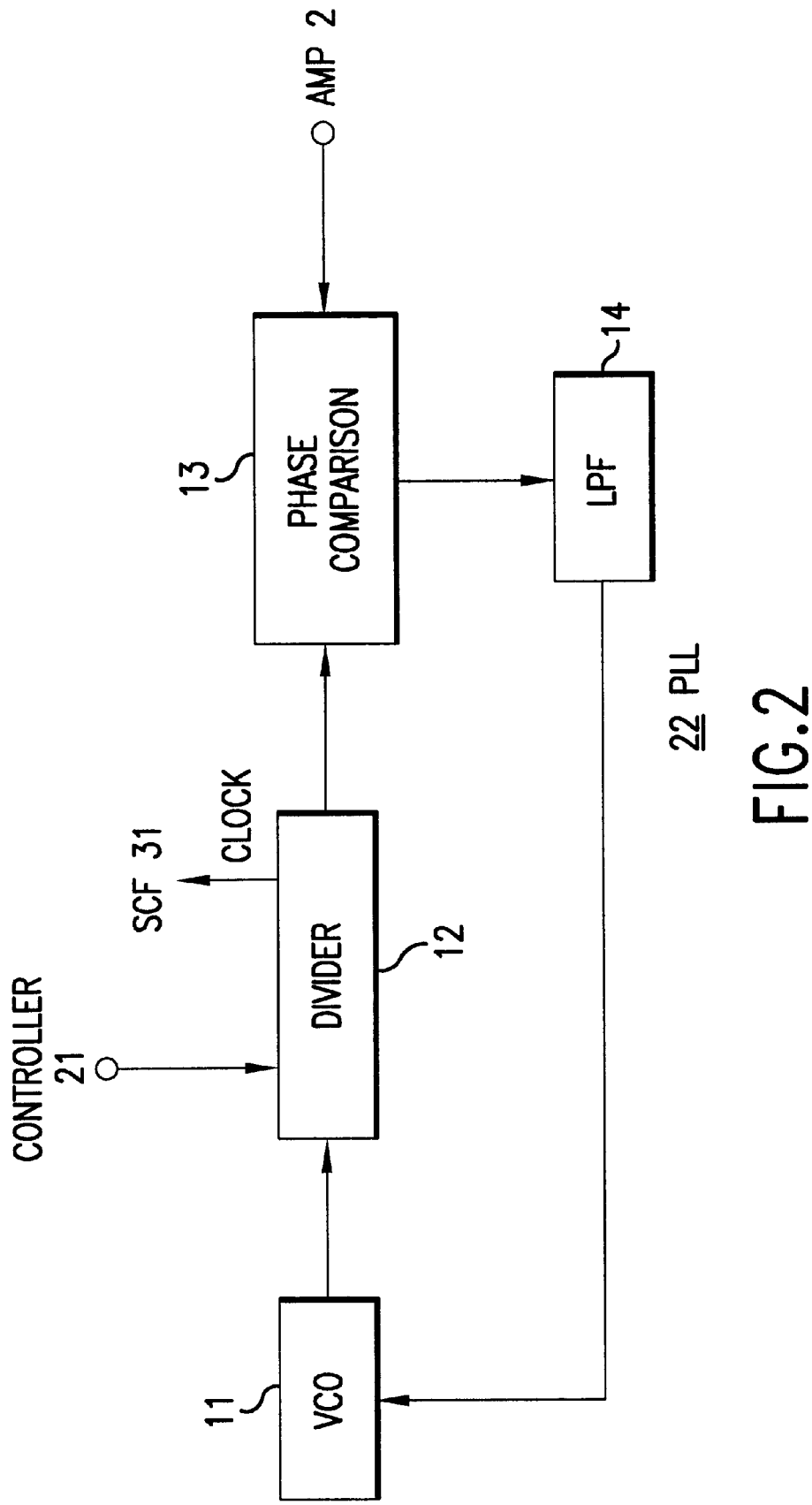
FIG. 2 is a schematic block diagram showing a construction of a PLL circuit of the signal receiver of FIG. 1.

FIG. 2 shows a schematic block diagram of a construction of the PLL circuit 22, in which a signal outputted from the amplifier 2 is applied to a phase comparison circuit 13. The phase comparison circuit 13 compares a clock entered by a frequency divider 12 with a phase of the signal outputted from the amplifier 2, and the phase error is applied to an LPF (low pass filter) 14. The LPF 14 removes a high frequency component of the entered signal to apply the removed signal to a VCO (voltage controlled oscillator) 11.

The VCO 11 applies a signal of a frequency corresponding to a control voltage entered by the LPF 14 to the frequency divider 12. The divider frequency-divides the signal applied by the VCO 11 at a division ratio corresponding to the control signal SGL applied by the controller 21, and applies a clock generated by the division to the phase comparison circuit 13 to be outputted to the SCF 31.

Figure 3:
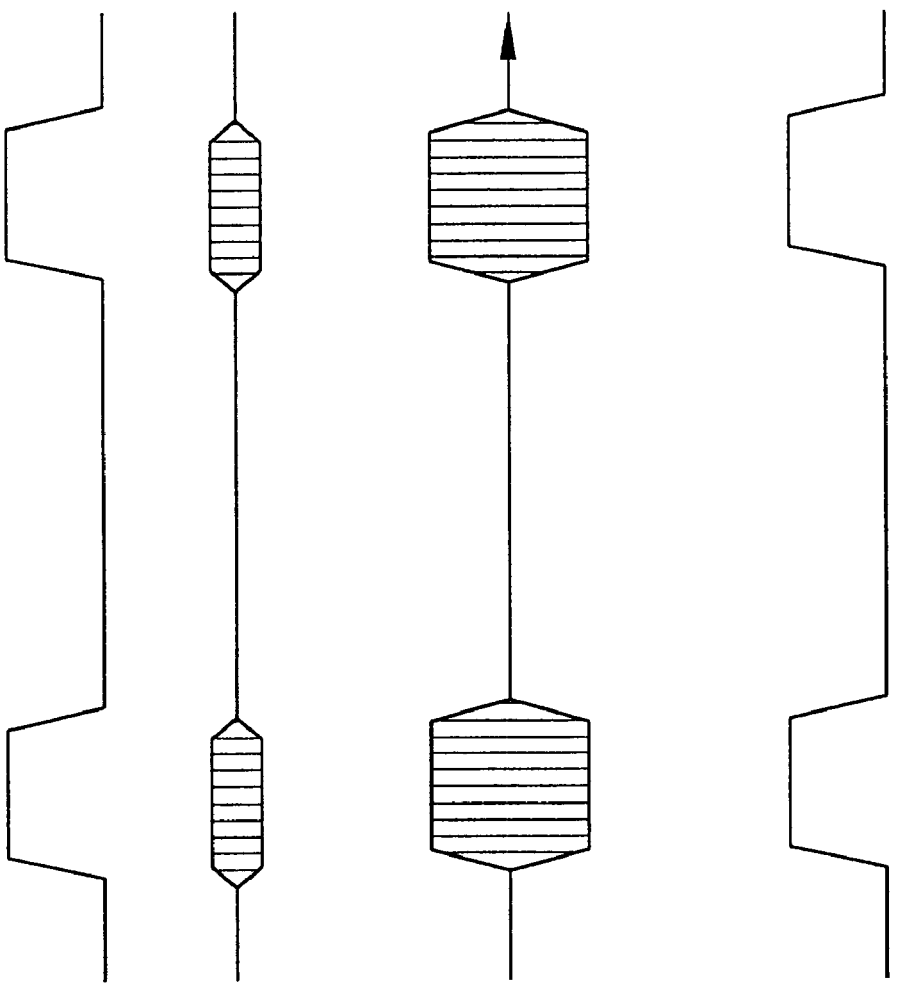
FIG. 3 shows waveforms to explain an operation of the signal receiver of FIG. 1.

Referring to FIG. 3, an operation of the signal receiver in this embodiment will be described hereinafter. As a modulated signal (FIG. 3 at (B)) modulated based on predetermined data (FIG. 3 at (A)) from a signal transmitter (not shown in drawings) is entered, the modulated signal is amplified by the amplifier 2, and delayed in the SCF 31 by the time $^1\tau$ so that its phase is delayed by $^x\pi$. The delay time $^2\tau$ is regulated based on the clock generated by the PLL circuit 22.

The amplifier 32 amplifies the output of SCF 31 to be applied to the adder 1. The adder 1 adds the signal applied by the amplifier 32 to the modulated signal to be applied to the amplifier 2.

The above operation is repeated, and the amplifier 2 produces a carrier at a large level as a superregenerative signal output (FIG. 3 at (C)) when a modulated signal exists. If the detector circuit 23 envelope-detects the output of the amplifier 2, an signal at a high level appears when a superregenerative signal at a large level exists but a signal at a low level appears when any superregenerative signal at a large level does not exist (FIG. 3 at (D)). The detected signal at the high level corresponds to logic "1" and the detected signal at the low level corresponds to logic "0", whereby the transmission data may be read by this logic.

In the PLL circuit 22 of FIG. 2, the phase comparison circuit 13 compares the superregeneration output applied by the amplifier 2 with the clock inputted by the frequency divider 12 as to the phases, and applies its phase error to the VCO 11 through the LPF 14. The VCO 11 produces a signal of a frequency corresponding to the phase error signal applied through the LPF 14. The output produced by the VCO 11 is divided at a predetermined division ratio by the frequency divider 12 to be applied to the phase comparison circuit 13. Accordingly, a servo is so applied that the signal, which the frequency divider 12 outputs, may synchronize with the phase of the signal which the amplifier 2 outputs. The clock produced by dividing the output of the VCO 11 corresponding to the control signal of the controller 21 in the frequency divider 12 becomes a clock of the frequency corresponding to the control signal from the controller 21. The clock controls the delay time of the SCF 31.

Figure 4:
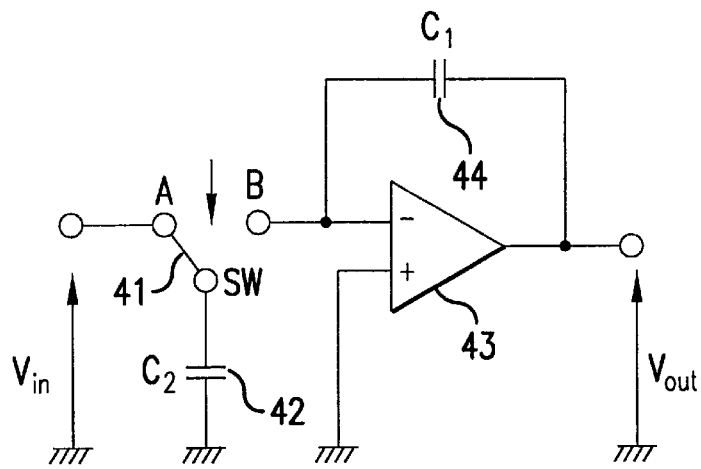
FIG. 4 is a schematic block diagram of an SCF of the signal receiver of FIG. 1.

In FIG. 4 there is shown an example of a construction of the SCF 31. The output of the amplifier 2 is charged into a capacitor 42 having a capacity C2 through a terminal A of a switch 41, while it is applied to an inverting input terminal of an operational amplifier 43 from the capacitor C2 when the switch 41 is turned to a terminal B. The switch 41 is synchronized with the clock produced from the PLL circuit 22, for example, whereby it is turned to the terminal A when the clock is at a high level and to the terminal B when the clock is a low level. A non-inverting input terminal of the operational amplifier 43 is grounded. An output Vout of the operational amplifier 43 is fed back to the inverting input terminal thereof through a capacitor 44 having a capacity C1, and applied to the amplifier 32.

Figure 5:
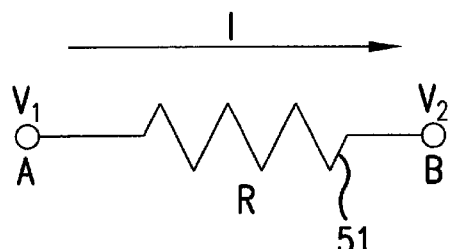
FIG. 5 is an equivalent circuit of a switch and a capacitor of the SCF of FIG. 4.

Next, an operation of the SCF 31 of FIG. 4 will be described hereinafter. As shown in FIG. 5, assuming that a resistor 51 having a value R is interposed between the terminals A and B, an electric potential at the terminal A is V1 and an electric potential at the terminal B is V2, the current I flowing through the resistor 51 is expressed by the following equation;

$$I=(V1-V2)/R \quad (1)$$

A charge Q charged in a capacitor having a capacity C when a voltage V is applied to the capacitor is expressed by the following equation:

$$Q=CV \quad (2)$$

The current is a charge quantity passing per a time unit by the definitions, and expressed by the following equation;

$$I=dQ/dt \quad (3)$$

Figure 6:
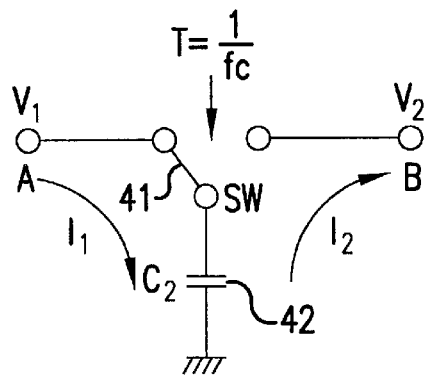
FIG. 6 is a chart to explain switching of the capacitor.

When the resistor 51 connected with between the terminals A and B of FIG. 5 is replaced by a capacitor 42 shown in FIG. 6, an electric potential difference applied to the capacitor 42 having a capacity C2 is (V1–V2), so that a charge quantity flowing from the terminal A to the terminal B in one period of the switch 41 is expressed by the following equation;

$$I=QTOTAL=C2(V1-V2) \quad (4)$$

Assuming that a period T=1/fc (fc: clock frequency) switching the switch 41 is much shorter than a charging time of the capacitor 42, a total charge quantity flowing from the terminal A to the terminal B is QTOTAL, and a mean current I is expressed by the following equation;

$$I=QTOTAL/T=C2(V1-V2)/T \quad (5)$$

The next equation is provided from the above-mentioned equations (1) and (5);

$$R=T/C2 \quad (6)$$

Figure 7:
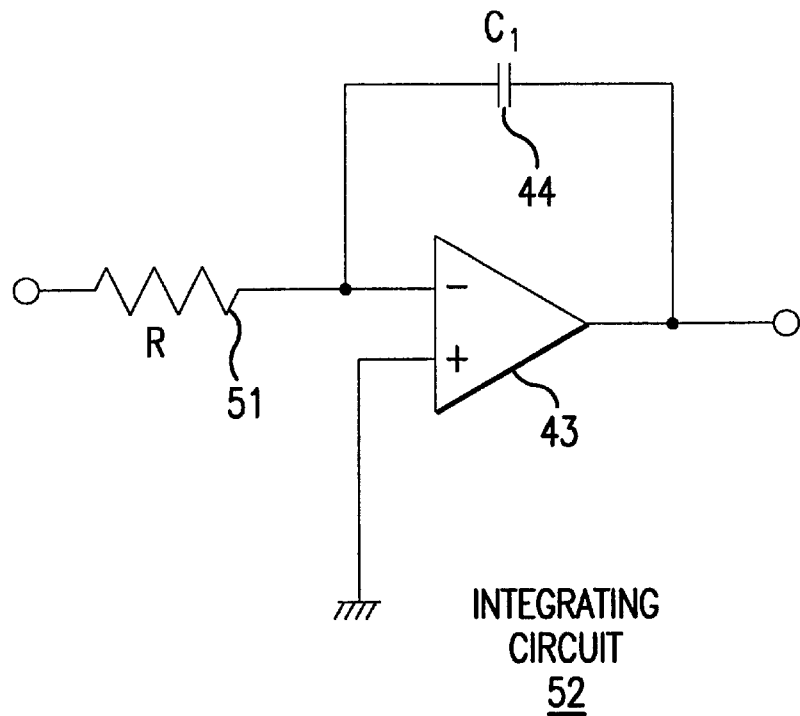
FIG. 7 is a circuit diagram of an integrating circuit.

This equation (6) means that an ohmic value on an appearance may be controlled by the period T of the clock. Accordingly, an integrating circuit 52 shown in FIG. 7 is constructed by replacing the switch 41 and the capacitor 42 with the resistor 51 of FIG. 5. The time constant $^1\tau$ of this integrating circuit 52 is expressed by the following equation;

$$^1\tau=RC1 \quad (7)$$

When the cut off frequency of this integrating circuit 52 is represented by "fc", it is expressed by the following equation;

$$fc=1/(^v Z\pi RC1) \quad (8)$$

The next equation is provided when the equations (7) and (8) are substituted by the equation (6).

$$^{\perp\tau}RC1=(C1/C2)T \quad (9)$$

$$fc=1/(^v Z\pi(C1/C2)T) \quad (10)$$

Figure 8:
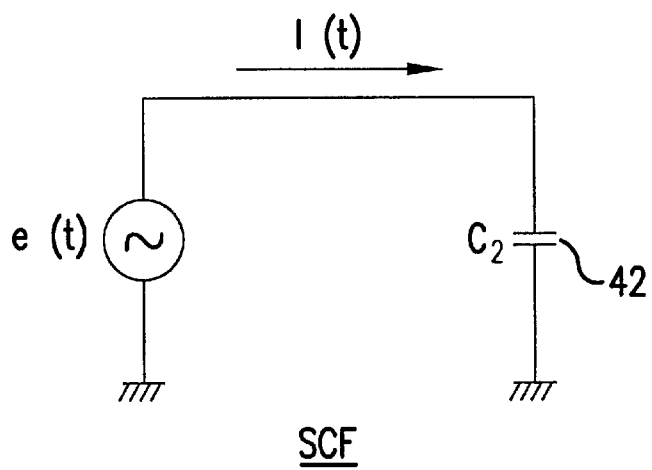
FIG. 8 shows an equivalent circuit of the SCF of FIG. 4.

When the switch 41 is turned to the terminal A, an equivalent circuit of the SC F 31 is shown in FIG. 8. Assuming that the input signal is expressed by the following equation;

$$e(t)=E\sin^m \omega t \quad (11)$$

and a current flowing through the capacitor 41 is i(t), and the duty rate of the clock is 50%, the time period when the switch 41 is turned to the terminal A becomes T/2 where T is a period of the clock. Accordingly, the quantity of charge Q2 charged then in the capacitor 42 is expressed by the following formula;

[formula 1] \quad (12)

$$Q_2 = \int_0^{T/2} i(t)\,dt$$
$$= C_2 \int_0^{T/2} \frac{de(t)}{2}\,dt$$
$$= C_2 E \sin\frac{\omega T}{2}$$

Figure 9:
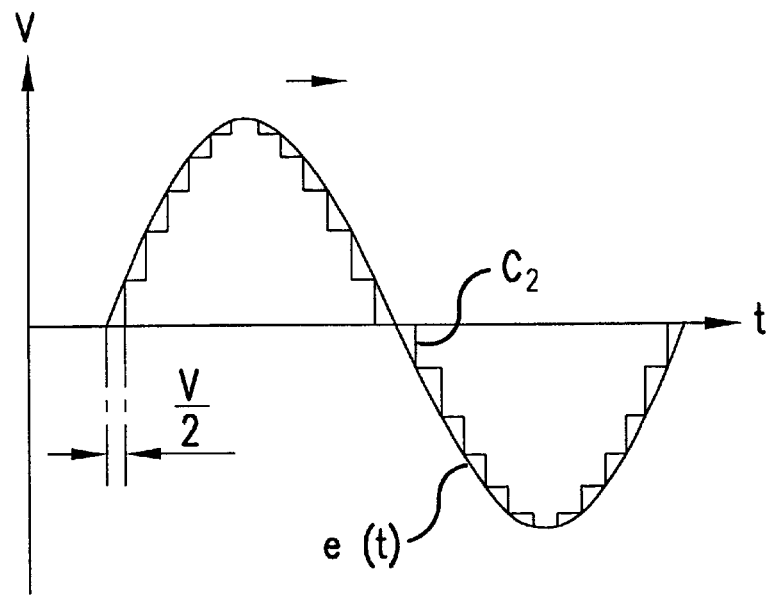
FIG. 9 shows a waveform to explain a change of an electric potential of a capacitor of FIG. 8.

Assuming that the period T varies in much lower period than the period of the input signal, the capacitor 42 is regarded as a constant voltage source a value of which changes by disintegration in view of the succeeding steps. As shown in the equation (11), the input signal e(t) is a sine wave, thereby the electric potential at the capacitor 42 with a capacity C2 being regarded as a pseudo sine wave which changes in a step fashion as shown in FIG. 9 which shows the input signal e(t) and the electric potential of C2.

Figure 10:
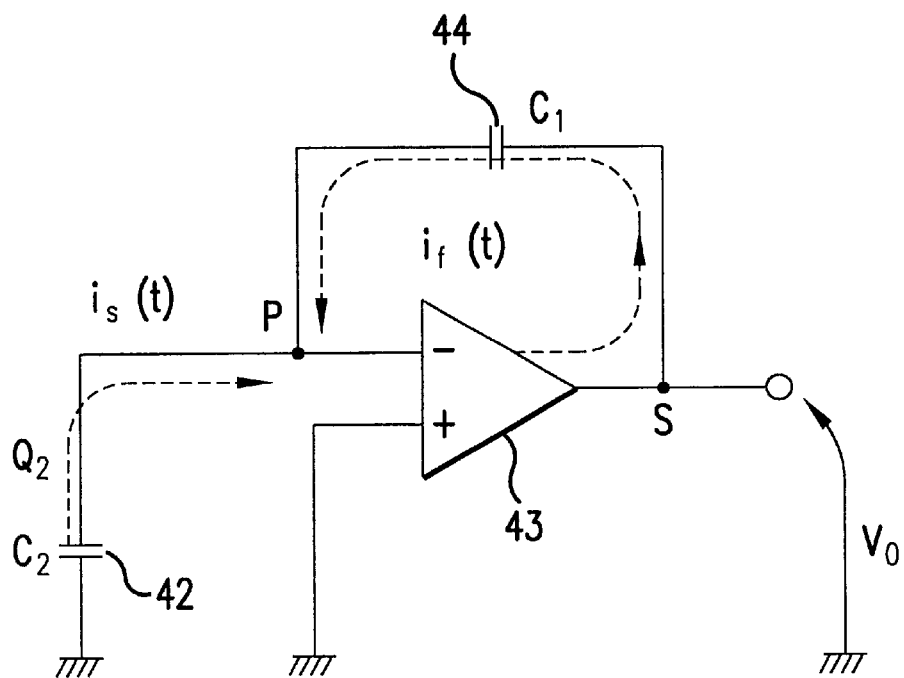
FIG. 10 is a circuit construction when a switch of the SCF of FIG. 4 is turned to a contact B side.
Figure 11:
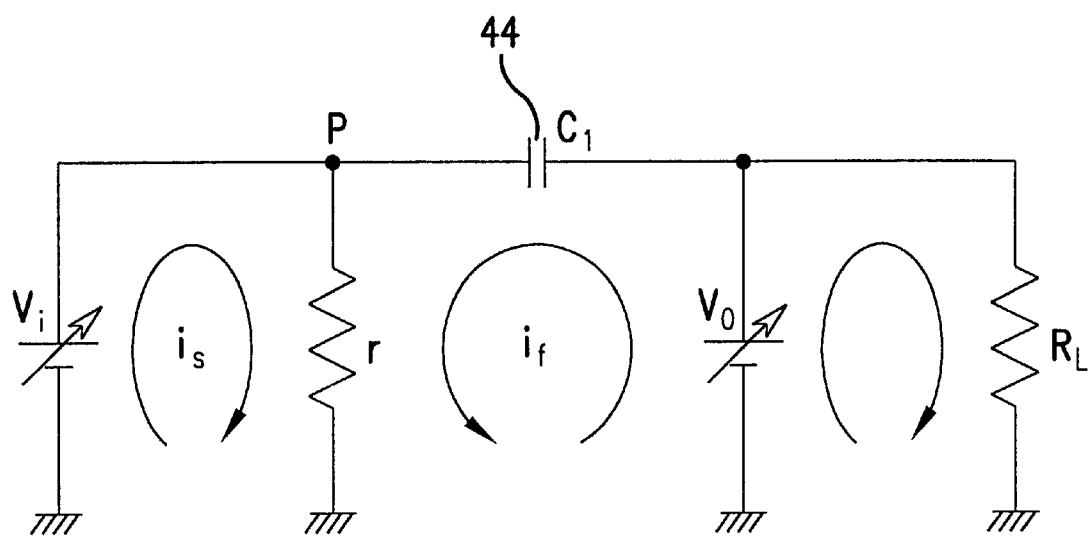
FIG. 11 shows an equivalent circuit of the circuit of FIG. 10.

FIG. 10 shows a circuit configuration when the switch 41 of the SCF 31 is turned to the terminal B side, an equivalent circuit of which is shown in FIG. 11.

Since the non-inverting input terminal of the operational amplifier 43 is grounded in FIG. 10, the inverting input terminal is grounded in view of a direct current.

In FIG. 11, a resistance "r" represents an internal resistance of the operational amplifier 43, and a resistance "RL" represents a load of thee operational amplifier 43.

An electric potential Vi charged in the capacitor 42 is expressed by the following equation;

$$Vi=Q2/C2 \quad (13)$$

The charge Q2 charged in the capacitor 42 is discharged electricity through the internal resistance "r" of the operational amplifier 43 from a point P (ground), wherein the feedback loop by a capacitor 44 of operational amplifier 43 is applied by an output voltage V0 expressed by the following equation in the operational amplifier 43;

$$V0=A^x \times Vi/(1+A^d \beta) \quad (14)$$

wherein "A" represents a gain of the operational amplifier 43 and β" represents a feedback ratio thereof.

Accordingly, a discharge current "is" flowing through the capacitor 42 and a feedback current "if" flowing through the capacitor 44 flow as shown in FIG. 11.

Thus, according to this embodiment, there is provided a superregeneration means (superregenerative circuit 10 of FIG. 1) for feeding back a part of an output signal to form part of an input signal through a feedback route to execute a superregeneration, a capacitance element (capacitor 42 of FIG. 4) disposed in the feedback route of the superregeneration means, switching means (switch 41 of FIG. 4) for switching the capacitance element, and a generating means (PLL circuit 22 of FIG. 1) for generating a clock switching the switching means based on an output of the superregeneration means.

Figure 12:
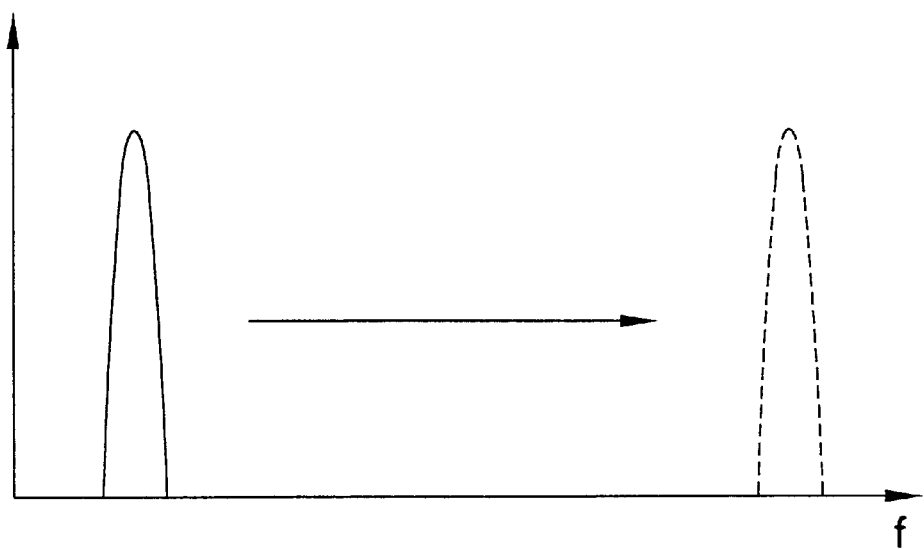
FIG. 12 shows a change of frequency received by the signal receiver of FIG. 1.

Further, according to this embodiment, a predetermined control signal is produced by the controller 21, the clock of a predetermined frequency is produced by the PLL circuit 22, and the switching speed of the switch 41 is appropriately changed, so that the frequency reproduced by the superregenerative circuit 10 may be largely changed to an arbitrary value to be set as shown in FIG. 12.

Figure 13:
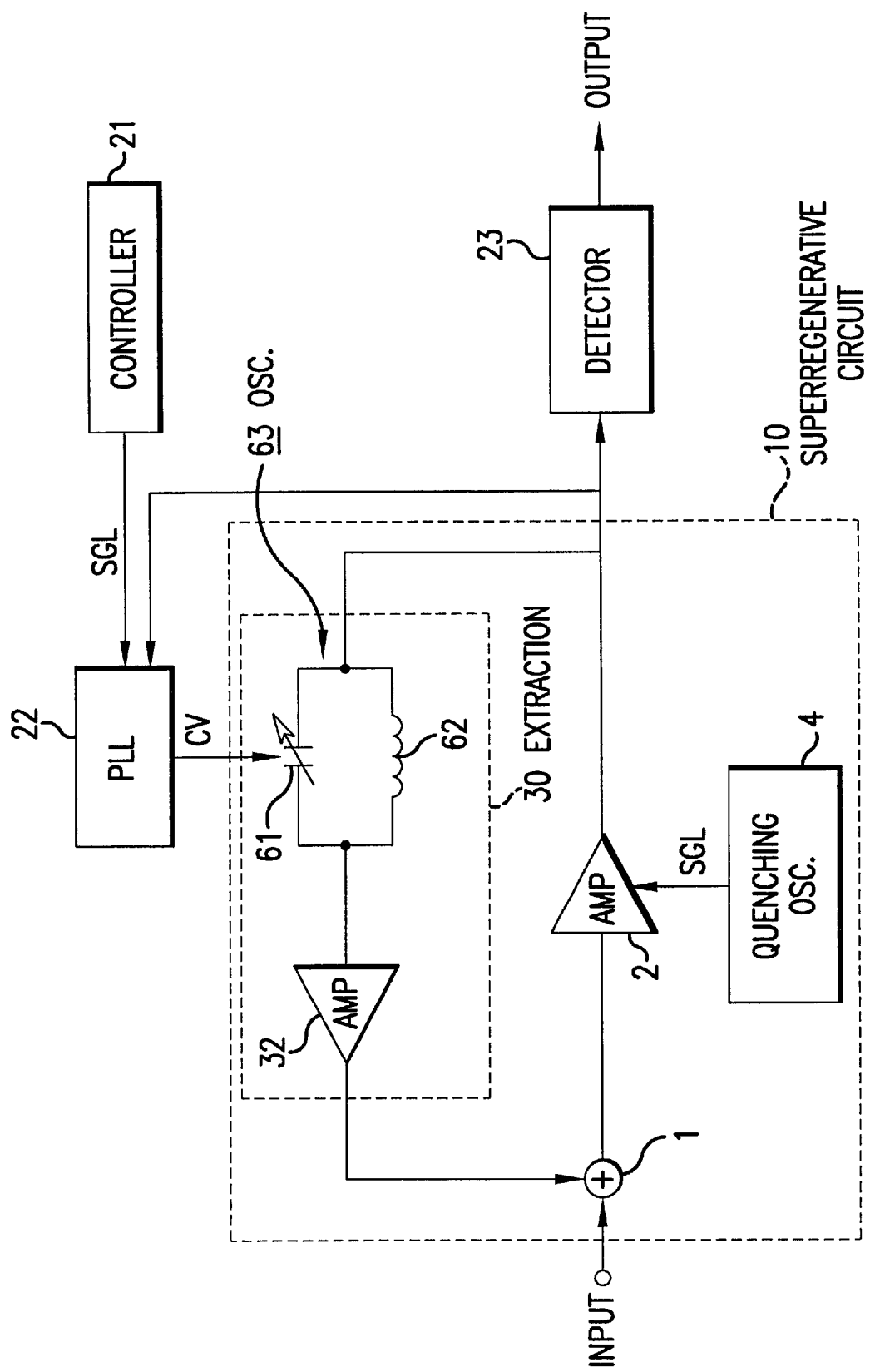
FIG. 13 a schematic block diagram of a signal receiver as a second embodiment of this invention.

In FIG. 13, there is shown a signal receiver according to a second embodiment of this invention. In a superregenerative circuit 10 of this embodiment, a resonance circuit 63 of a parallel circuit of a variable capacity capacitor 61 and a coil 62 is disposed in an extraction circuit 30, instead of the SCF 31 of FIG. 1. The capacitance of the variable capacity capacitor 61 is controlled for the correspondence to the control voltage CV that a PLL circuit 22 outputs. Other components are same as those of FIG. 1.

In this embodiment, the capacitance of the variable capacity capacitor 61 is controlled for the correspondence to an output of a LPF (corresponding to the LPF 14 of FIG. 2) in the PLL circuit 22. As a result, the resonance frequency of the resonance circuit 63 varies, whereby same effects as those in the first embodiment shown in FIG. 1 may be found.

Figure 14:
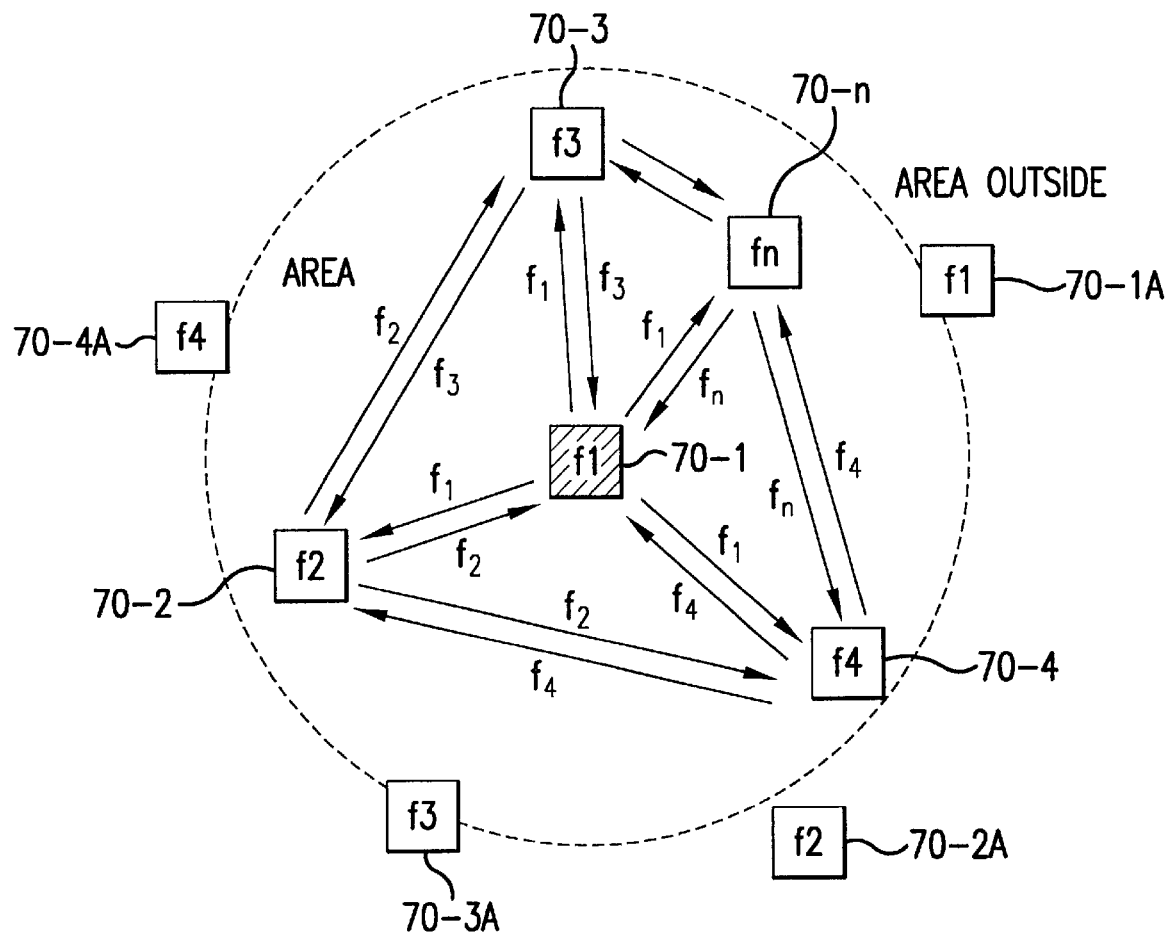
FIG. 14 is a schematic block diagram of a network as a third embodiment of this invention.

FIG. 14 shows a network composed of a plurality of transceivers as a third embodiment of this invention. Transceivers 70-1 to 70-n are disposed within an area to be communicated one after another by employing frequencies f1 to fn. Transceivers 70-1A to 70-4A are arranged in area outside so that they do not interfere with the communications within the area.

Figure 15:
FIG. 15 shows a format of transmission data.
Figure 15:

As shown in FIG. 15, each transceiver 70-i (i=1, 2, ..., n) utilizes a control channel of a common frequency f0 in each transceiver from 70-1 to 70-n and notifies a counterpart of the frequency of data transmission carrier of the oneself, thereafter transmitting the transmission data by utilizing a channel of a frequency fi assigned to oneself. The transmission data is provided with header and footer arranged at the beginning and end thereof, thereby detecting the initiation point and the end point.

Figure 16:
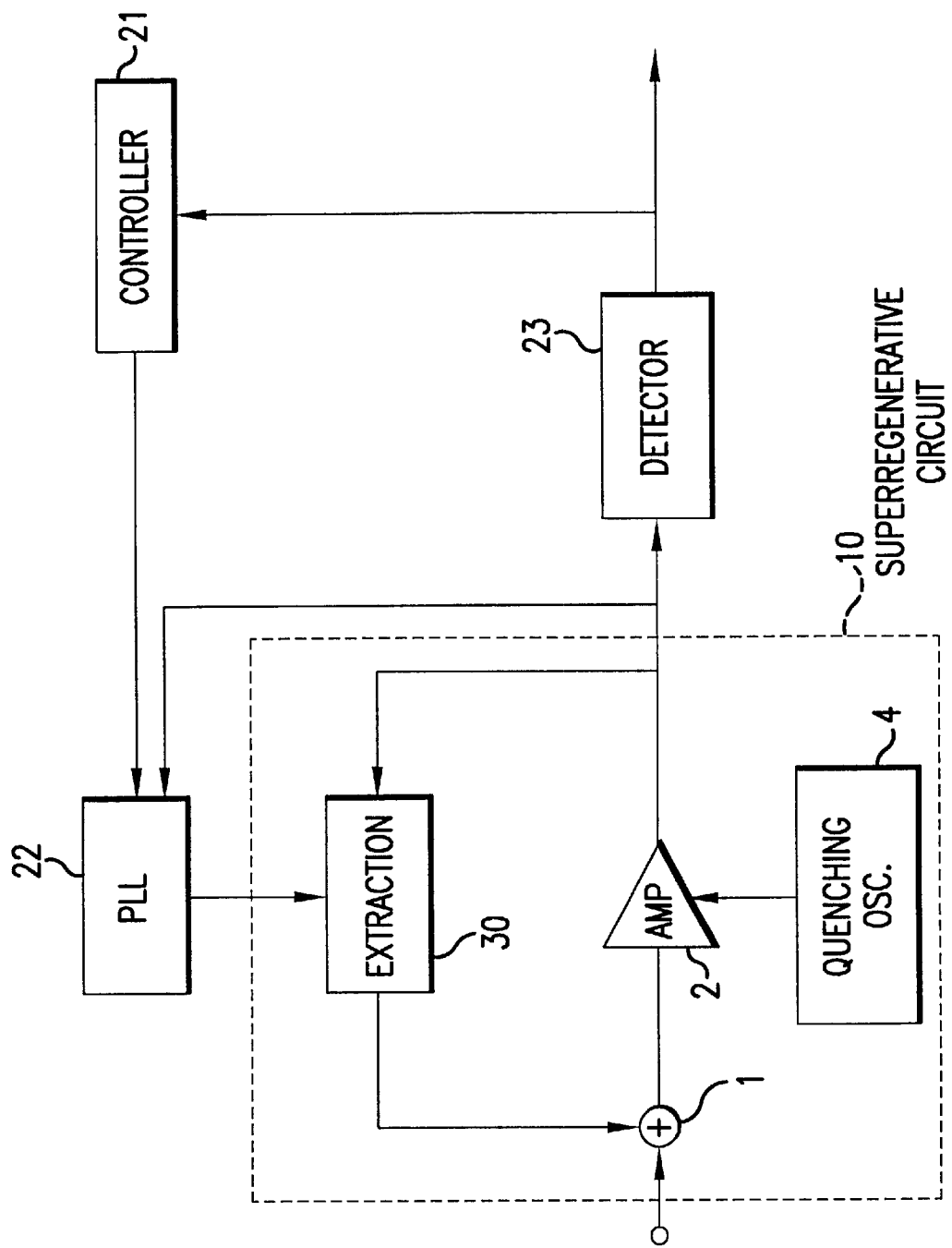
FIG. 16 is a schematic block diagram of a signal receiver employed in the network of FIG. 14.

FIG. 16 shows an example of a signal receiver of the transceiver 70-i of FIG. 14. In this signal receiver, the output of a detector circuit 23 is supplied to a controller 21. The controller 21 reads the control channel information transmitted by a signal transmitter from the output of the detector circuit 23, and the PLL circuit 22 is controlled to receive a transmission frequency designated therein. Other components are same as those in FIG. 1.

Figure 17:
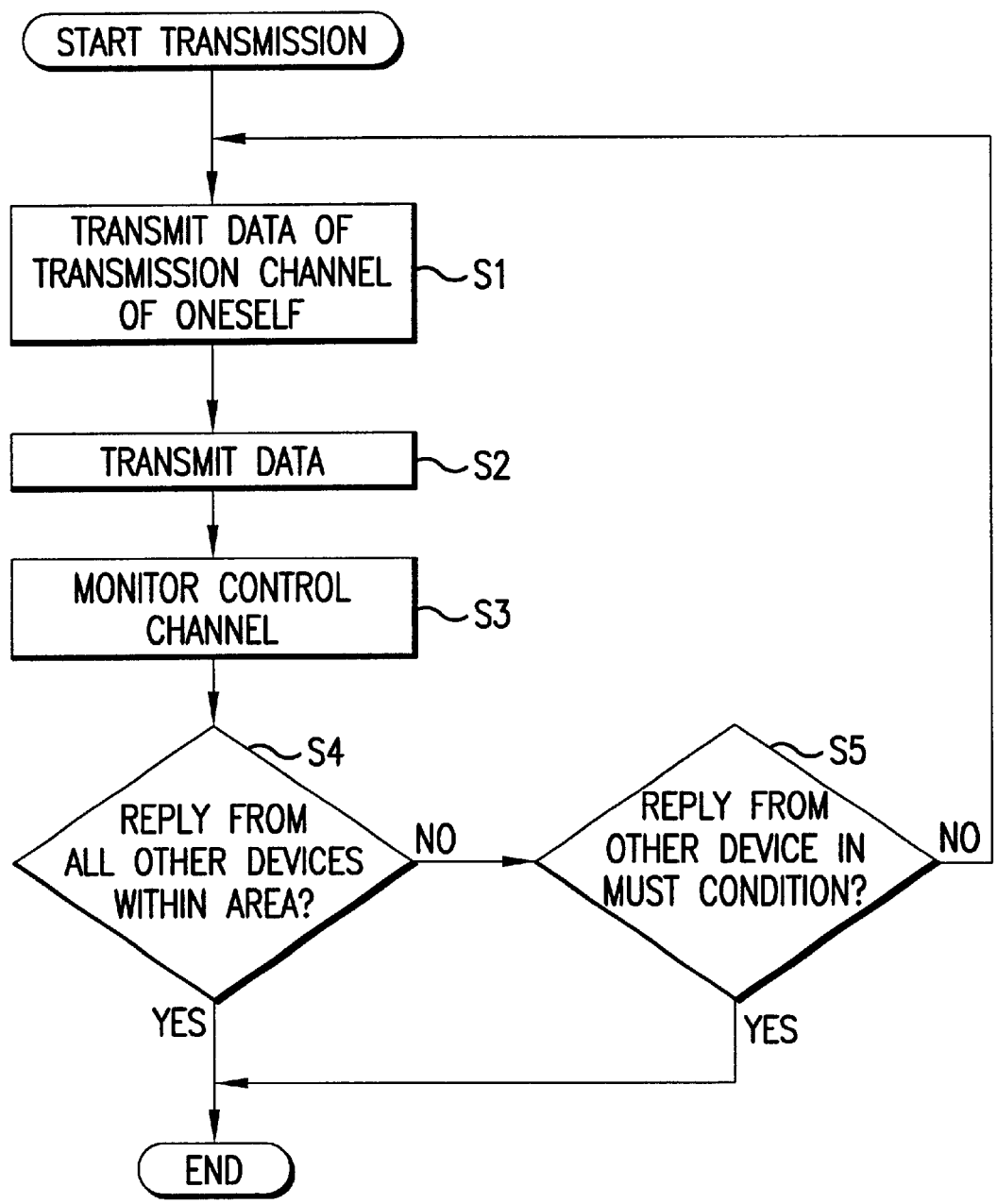
FIG. 17 shows a flowchart to explain a transmission and reception process in the network system of FIG. 14.

Referring to a flowchart of FIG. 17 and a timing chart of FIG. 18, a transmission operation of the transceiver 70-i will be described hereinafter.

Figure 18:
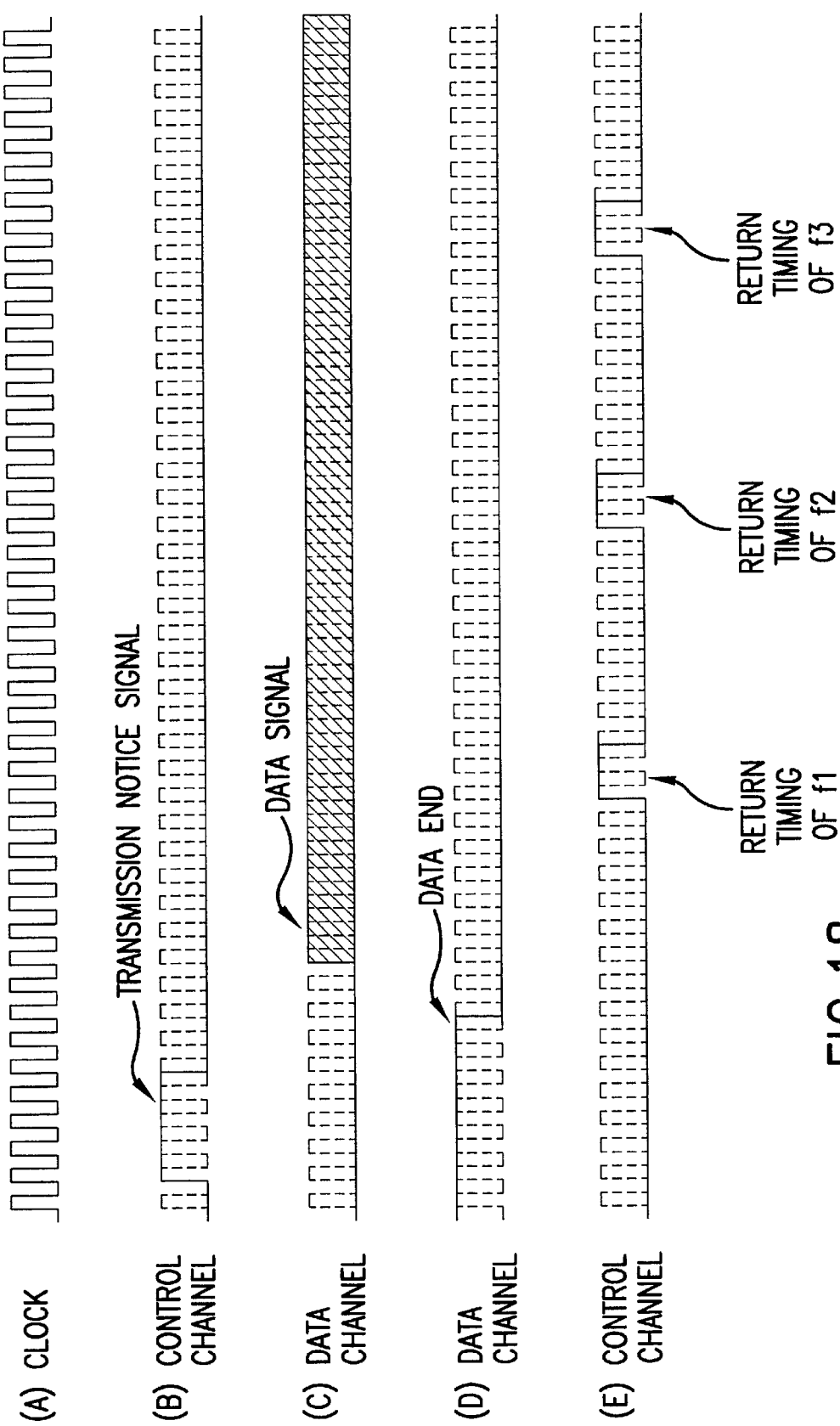
FIG. 18 is a chart for explaining an allotment of time slot of a control channel in the network system of FIG. 14.

First, in a step S1, a transmitter (not shown in drawings) of the signal transceiver 70-i transmits in advance a transmission notice signal and data representing a frequency of a transmission channel oneself (FIG. 18 at (B)) by employing the control channel of the frequency f0 in synchronization with the clock (FIG. 18 at (A)) generated in the built-in oscillator circuit. In a step S2, the data is transmitted through the channel of the frequency fi assigned to oneself (FIG. 18 at (C)).

After sending a data end signal through the channel of the frequency fi (FIG. 18 at (D)), the signal receiver section of the signal transceiver 70-i receives a signal of a control channel of the frequency f0 assigned to each slot in a step S3 (FIG. 18 at (E)). In a step S4, it is inquired if there are replies from all other signal transceivers within the communication area. Unless at least one of the signal transceivers makes any reply, the sequence moves to a step S5 wherein it is inquired if there is any reply from other signal transceiver in a MUST condition (signal transceiver expected to be replied). The sequence returns to the step S1 when there is no response from any other signal transceivers in the MUST condition, thereby again executing the signal transmission-and-receipt process.

When it is confirmed to have received replies from all other signal transceiver in the steps S4 or when it is confirmed to have received a reply from other signal transceiver in the MUST condition in the step S5, the communication process is finished.

Figure 19:
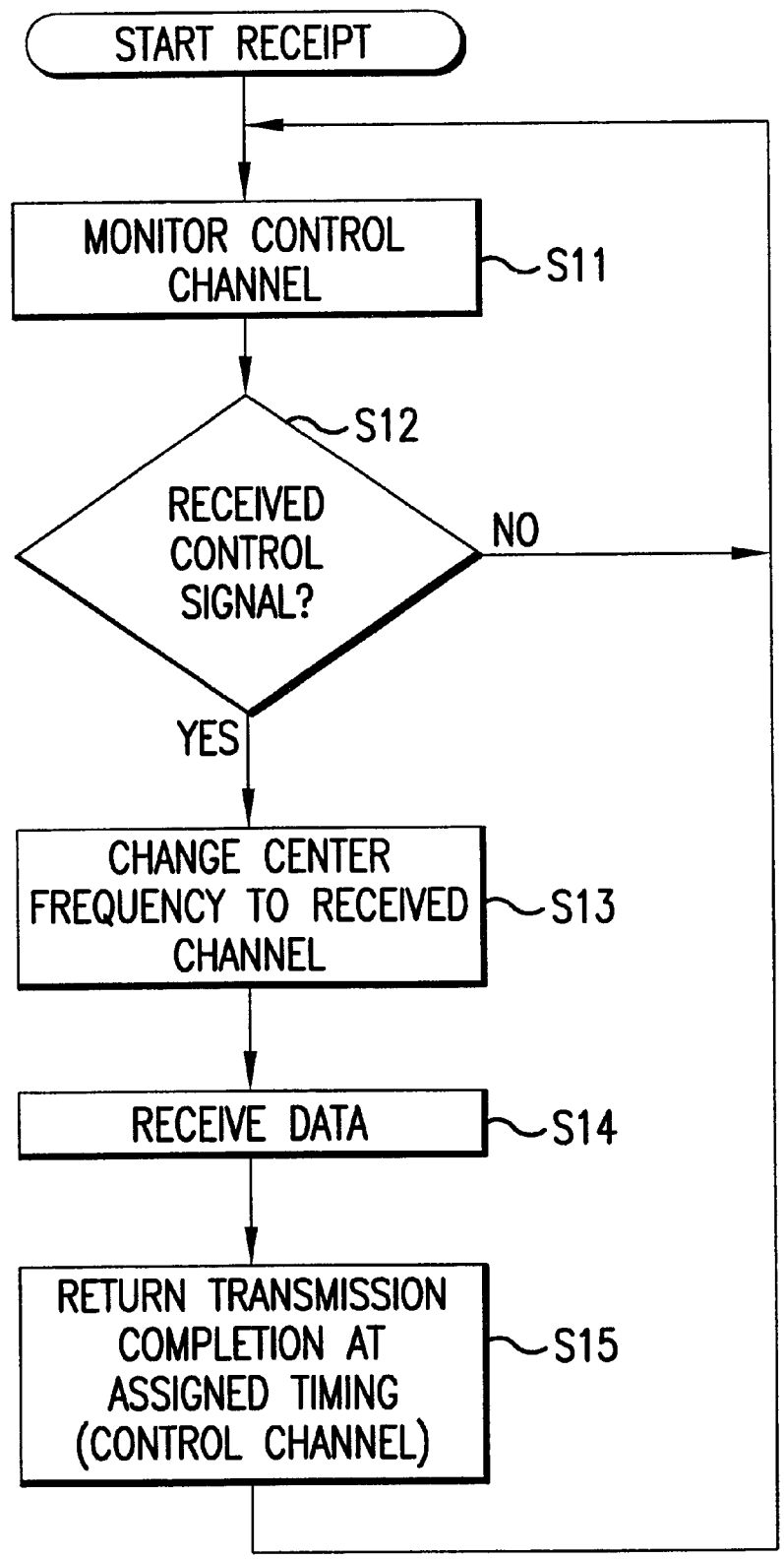
FIG. 19 is a flowchart to explain a reception process in the network system of FIG. 14.

Upon finishing the transmission process by one signal transceiver 70-i, other signal transceiver 70-j executes such a reception process as shown by a flowchart of FIG. 19.

First, in a step S11, the receive section of the signal transceiver 70-j receives the control channel of the frequency f0, and in a step S12 it is inquired if the receive section has received a control signal. Unless the control signal is received, the sequence returns to the step S11 and the reception process is executed repeatedly.

When the control signal is received in the step S12, the sequence moves to a step S13 in which the controller 21 in the signal receive section of the signal transceiver 70-j reads the channel information included in the control signal transmitted by the counterpart. In the step S13, the controller 21 controls the PLL circuit 22 so as to receive the carrier of the read frequency by a superregenerative circuit 10. For the correspondence to the control by the controller 21, the PLL circuit 22 controls an extraction circuit 30, extracts the carrier of the set frequency, and controls the SCF or the variable capacity capacitor 61 of the resonance circuit 63, thereby allowing the superregenerative circuit 10 to receive the carrier of the frequency fi.

In a next step S14, the controller 21 receives and reads the signal transmitted by the counterpart through the detector circuit 23. Upon the completion of the receipt process, the controller 21 returns a response of receipt completion of the data to the signal transceiver 70-i by using the control channel at the time slot assigned to oneself (FIG. 18 at (E)).

The sequence returns to the step S11, the sequence is executed repeatedly afterwards.

Accordingly, according to this embodiment, there may be provided a home doctor system in which data such as a temperature, a blood pressure or the like of a family measured in one room of a home is sent to a predetermined apparatus by wireless to be stored into a data base.

Thus, according to this embodiment, there is provided a signal receiver which includes a level detection means (the detector circuit 23 of FIG. 16) for detecting the level of output of the superregeneration means (superregenerative circuit 10 of FIG. 16), and a control means (controller 21 of FIG. 16) for controlling a generating means (PLL circuit 22 of FIG. 16) for the correspondence to the output of the level detection means.

Figure 20:
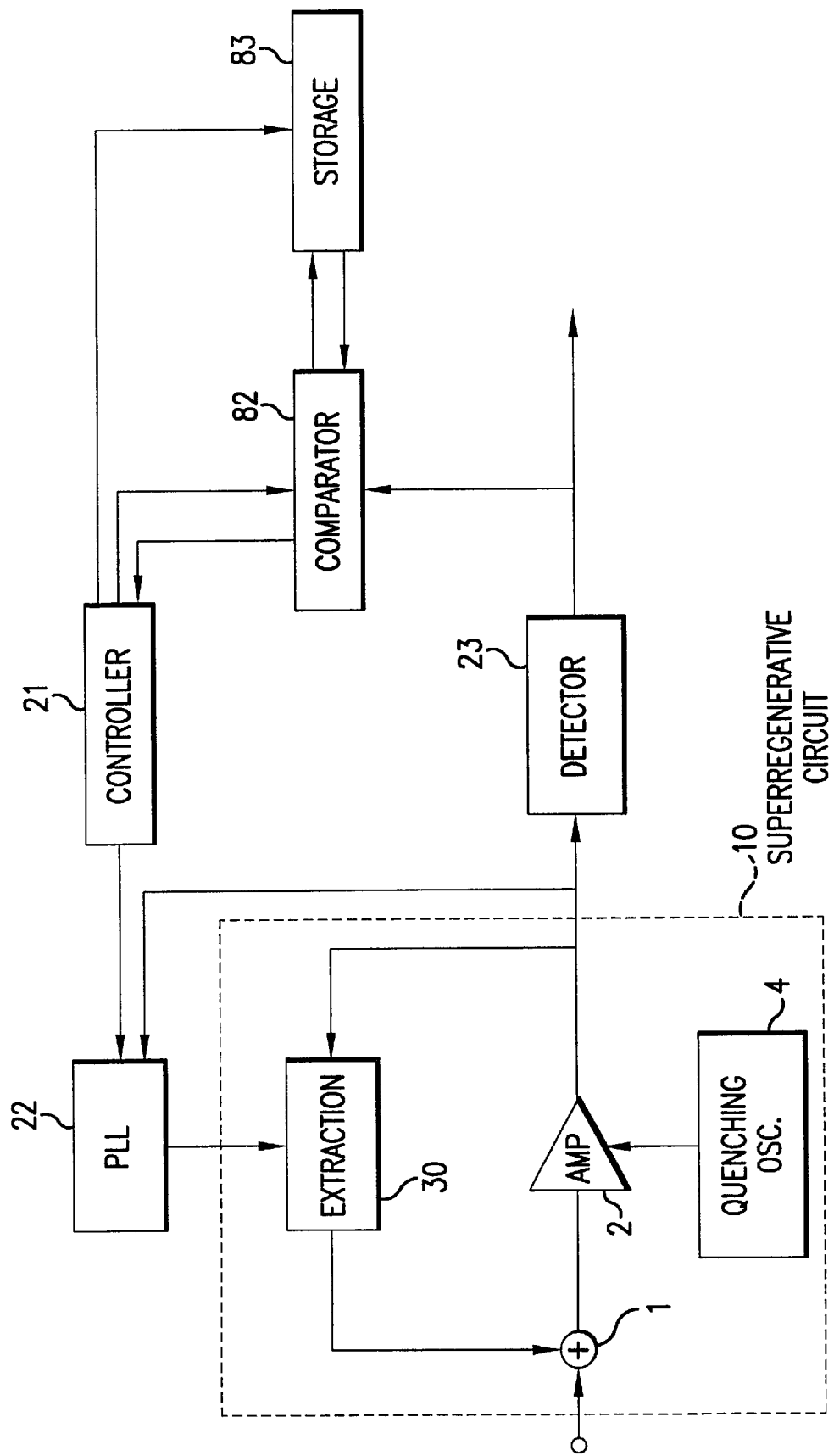
FIG. 20 is a schematic block diagram of a signal receiver as a fourth embodiment of this invention.

In FIG. 20, there is shown a signal receiver as a fourth embodiment of this invention, in which a comparator circuit 82 compares the output of the detector circuit 23 with the value stored in a storage 83 and outputs the comparison results to a controller 21. The controller 21 controls the operation of the comparator circuit 72 and the storage 83.

Figure 21:
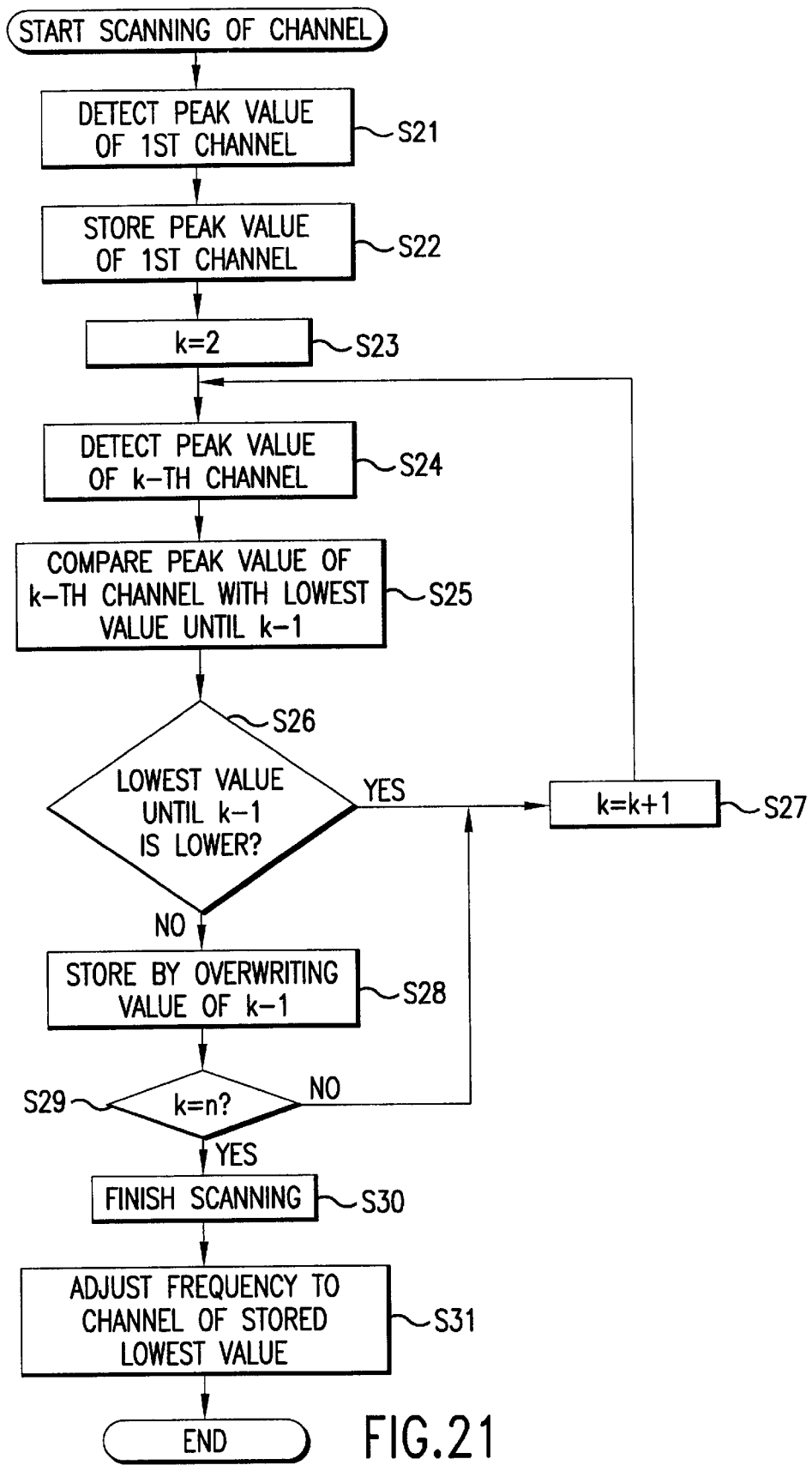
FIG. 21 is a flowchart to explain an operation of the signal receiver of FIG. 20.

In this embodiment, the communication is executed by using the channel with the lowest noise among n channels of the frequencies f1 to fn, and the operation will be described referring to a flowchart of FIG. 21.

First, in a step S21, the controller 21 controls the PLL circuit 22 allowing a superregenerative circuit 10 to receive a signal of a channel of a frequency f1. In a step S22, a comparator circuit 82 allows the storage 83 to store a peak value of the received signal received upon detecting an output of the detector circuit 23.

Next, the controller 21 sets a variable k representing a number of processing times (processed channels) to "2" in a step S23, and executes the detection of a peak value of a k-th channel (currently, second channel) in a step S24. In other words the controller 21 controls the PLL circuit 22 allowing the superregenerative circuit 10 to receive a carrier of a frequency f2. Upon detecting the peak value of the detector circuit 23, the comparator circuit 82 compares it with the lowest peak value stored in the storage 83 until (k-1)th channel (currently, the first) in a step S25. Currently, the peak value of the first channel is stored in the storage 83, whereby the peak value of the first channel is regarded as the lowest peak value and compared with the peak value of the second channel.

Next, in a step S26, it is inquired by the comparator circuit 82 if the peak value stored in the storage 83 is lower than the peak value of the currently detected channel. If the peak value stored in the storage 83 is lower, the sequence moves to a step S27 in which the variable k is increased by "1" (currently, k=3), and returns to the step S24 for repeating the sequence thereafter.

In other words, when it is judged that the peak value of the first channel stored in the storage 83 is lower, k=3 is confirmed in the step S27, and the peak value of the third channel is detected in the step S24. As to the peak value of the third channel a same process is executed.

If it is judged that the peak value stored in the storage 83 is not lower (the peak value of a received current channel is lower) in a step S26, the sequence moves to a step S28 in which the comparator circuit 82 overwrites the peak value of the received current channel signal on the lowest value already stored in the storage 83.

Next, the sequence moves to an inquiry step S29, the controller 21 judges whether or not the variable k is equal to a value "n" of the last channel. If the variable k is not equal to n, the sequence returns to the step S27 to increase the variable k by "1" for executing the process after the step S24.

Figure 22A:
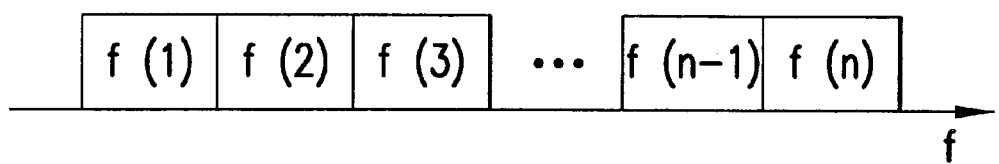
FIG. 22 is a chart for explaining the relation between a channel and noise.
Figure 22B:
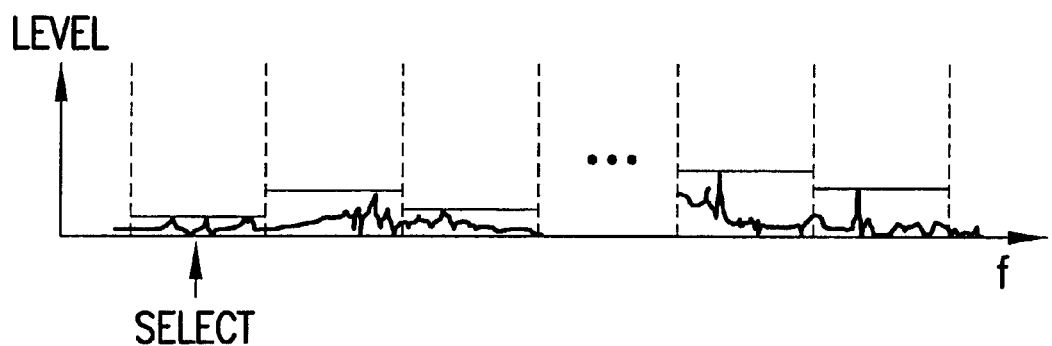

As shown in FIG. 22, by repeating the above-mentioned process, the peak values (FIG. 22 at (B)) of the receipt signals of n channels of the frequencies from f1 to fn (FIG. 22 at (A)) are received sequentially, thereby allowing the storage 83 to store the lowest therein.

If completion of the scanning of n channels is determined in the step S29, the sequence moves to a step S30 in which the controller 21 finishes the scanning process allowing the sequence to move to a step S31. In the step S31 the controller 21 controls the PLL circuit 22 to receive the channel with the lowest peak value (the channel with the lowest noise) stored in the storage 83. Thus, the signal receiver of this embodiment may receive a signal by using the channel with the lowest noise.

Thus, according to this embodiment, there is provided a signal receiver which includes a modification means (the controller 20 of FIG. 20) for changing a frequency of a signal regenerated by a superregeneration means (the superregenerative circuit 10 of FIG. 20), a level detection means (the detector circuit 23 of FIG. 20) for detecting the level of output of the superregeneration means, a frequency detection means (the storage 83 of FIG. 20) for detecting the frequency having the minimum noise among the frequencies of the signals regenerated by the superregeneration means as a result of detection by the level detection means, and a control means (the comparator circuit 82 of FIG. 20) for controlling the modification means for the correspondence to output of the frequency detection means.

Figure 23:
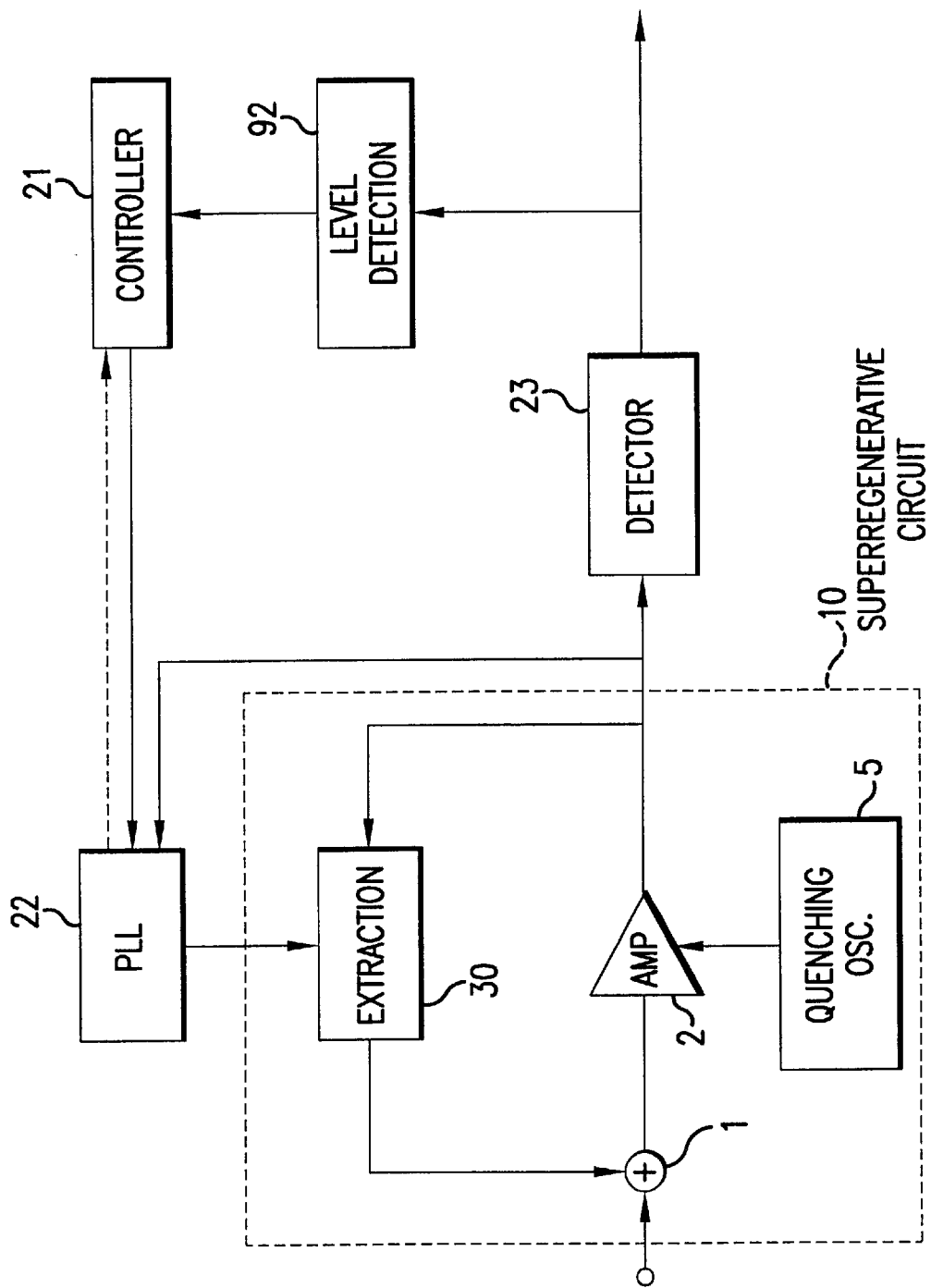
FIG. 23 is a schematic block diagram of a signal receiver as a fifth embodiment of this invention.

In FIG. 23, there is shown a signal receiver according to a fifth embodiment of this invention, in which an output level of a detector circuit 23 is detected by a level detection circuit 92 to apply the detection results to a controller 21. Other components are same as those of FIG. 1.

An operation of the signal receiver of FIG. 23 will be described hereinafter. The level detection circuit 92 detects a level of the detection signal produced by the detector circuit 23, and outputs the detection result to the controller 21. When the output level produced by the level detection circuit 92 becomes lower than a predetermined reference value, the controller 21 controls a PLL circuit 22 (a frequency divider 12) to change the reception frequency of a superregenerative circuit 10 a little. When the output level produced by the level detection circuit 92 is higher than the predetermined reference value, the adjustment operation is finished and the currently set frequency is received by the superregenerative circuit 10.

Figure 24:
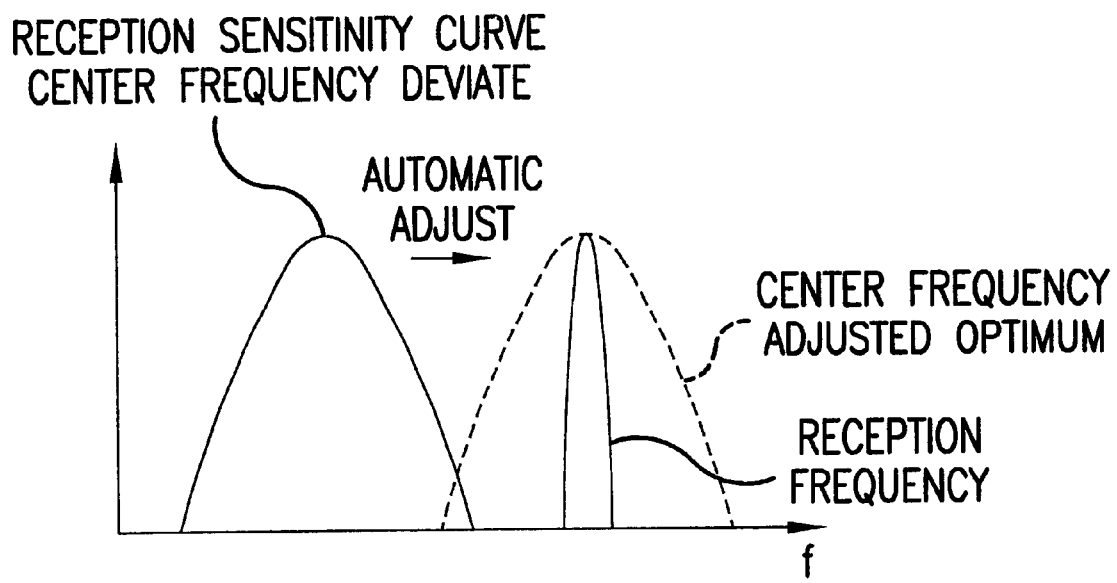
FIG. 24 shows waveforms to explain an adjustment operation of the signal receiver of FIG. 23.
Figure 25:
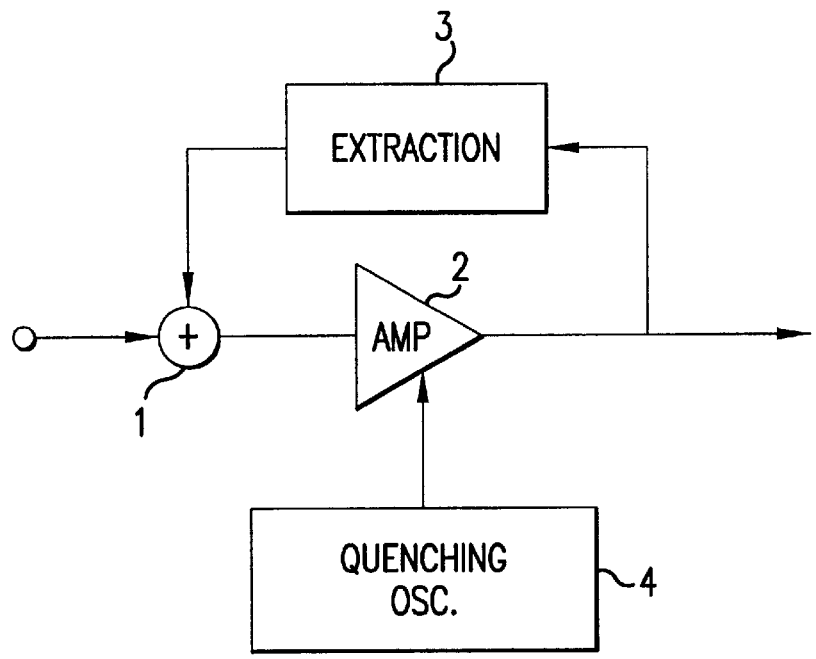
FIG. 25 is a schematic block diagram of a conventional superregenerative circuit.
Figure 26:
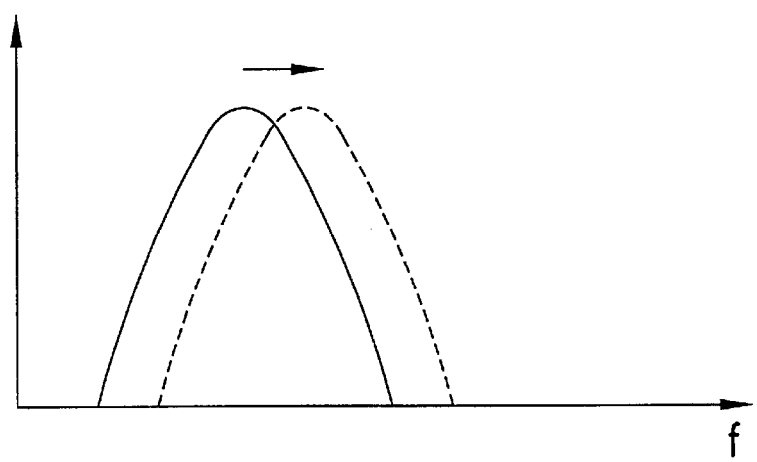
FIG. 26 shows waveforms to explain an adjustment operation of the conventional superregenerative circuit of FIG. 25.

Thus, the controller 21 of this embodiment automatically adjusts the most proper frequency to be set (favorably the maximum detection level may be obtained). Accordingly, for example, if the center frequency received by the superregenerative circuit 10 deviates due to time aging or temperature variations, the frequency is automatically adjusted to the optimum. Accordingly, as schematically shown in FIG. 24, the frequency to be originally received may be received with steep characteristics.

Thus, the signal receiver of this embodiment includes a control means (controller 21 of FIG. 23) for detecting an operation of the PLL circuit (22 of FIG. 23) to control the division ratio of the frequency divider according to a result of the detection.

If desired in this embodiment, the level detecting circuit 92 of the signal receiver in FIG. 23 may be deleted, and a control voltage from the LPF 14 to VCO 11 of the PLL circuit 22 may be monitored by the controller 21 as shown by a dotted line so that a division ratio of the frequency divider 12 of the PLL circuit 22 may be controlled when the value largely deviates from the reference value.

The quenching oscillator circuit 4 in the foregoing embodiments may be replaced with an AGC circuit controlling an amplification degree of the amplifier 2, the PLL circuit 22 may be replaced with an FLL circuit.

The signal receivers in the foregoing embodiments may be applied to a keyless entry system or other communication device, if desired.

The foregoing description of the invention has been presented for purposes of illustration and description. It is not intended to be exhaustive or to limit the invention to the precise forms described, and other modifications are possible in light of the foregoing teaching.

What is claimed is:

1. A signal receiver comprising:

a superregeneration circuit for feeding back a part of an input signal through a feedback route to execute superregeneration, a capacitance element disposed in the feedback route of said superregeneration circuit, a switch for switching said capacitance element, and a generator for generating a clock signal for switching said switch based on an output of said superregeneration circuit.

2. A signal receiver according to claim 1, wherein said capacitance element provides a switched capacitor filter.

3. A signal receiver according to claim 1, wherein said capacitance element provides a resonance circuit.

4. A signal receiver according to claim 1, wherein said generator includes a PLL circuit or an FLL circuit.

5. A signal receiver according to claim 1, wherein said generating means includes a PLL circuit having a frequency divider, a division ratio of which may be changed from the external.

6. A signal receiver according to claim 5, further comprising a controller for detecting an operation of said PLL circuit to control the division ratio of said frequency divider according to a result of the detection.

7. A signal receiver according to claim 1, further comprising a level detector for detecting the level of output of said superregeneration circuit, and a controller for controlling said generator according to the output of said level detector.

8. A transceiver comprising
   a signal transmitter for transmitting a signal to other transceiver, and
   a signal receiver according to claim 1 for receiving a signal transmitted from said other transceiver.

9. A network system comprised of more than one transceiver according to claim 8.

10. A signal reception method in a signal receiver which includes a superregeneration circuit for feeding back a part of an output signal to form part of an input signal through a feedback route to execute a superregeneration, a capacitance element disposed in the feedback route of said superregeneration circuit, and a switch for switching said capacitance element, comprising the steps of;
    generating a clock signal for switching said switch based on an output of said superregeneration circuit, and
    switching said switch based on said generated clock signal.

11. A signal receiver comprising:
    a superregeneration circuit for feeding back a part of an output signal to form part of an input signal through a feedback route to an input to execute superregeneration,
    a capacitance element disposed in the feedback route of said superregeneration circuit,
    a switch for switching said capacitance element,
    a generator for generating a clock signal for switching said switch based on an output of said superregeneration circuit,
    a modifier for changing a frequency of a signal regenerated by said superregeneration circuit,
    a level detector for detecting the level of output of said superregeneration circuit,
    a frequency detector for detecting the frequency having the minimum noise among the frequencies of the signals regenerated by said superregeneration circuit as a result of detection by said level detector, and
    a controller for controlling said modifier in response to an output of said frequency detector.

12. A signal receiver comprising:
    a superregeneration circuit for feeding back a part of an output signal to form part of an input signal through a feedback route to execute superregeneration,
    a capacitance element disposed in the feedback route of said superregeneration circuit,
    an operational amplifier disposed in the feedback route of said superregeneration circuit,
    a switch for switching said capacitance element, and
    a generator for generating a clock signal for switching said switch based on an output of said superregeneration circuit.

* * * * *